(12) United States Patent
Chang et al.

(10) Patent No.: US 9,306,122 B2
(45) Date of Patent: Apr. 5, 2016

(54) LIGHT EMITTING DIODE AND A MANUFACTURING METHOD THEREOF, A LIGHT EMITTING DEVICE

(71) Applicant: Enraytek Optoelectronics Co., Ltd., Shanghai (CN)

(72) Inventors: Richard Rugin Chang, Shanghai (CN); Deyuan Xiao, Shanghai (CN)

(73) Assignee: Enraytek Optoelectronics Co., Ltd., Shanghai (CN)

( * ) Notice: Subject to any disclaimer, the term of this patent is extended or adjusted under 35 U.S.C. 154(b) by 0 days.

(21) Appl. No.: 14/549,286

(22) Filed: Nov. 20, 2014

(65) Prior Publication Data

US 2015/0079713 A1    Mar. 19, 2015

Related U.S. Application Data

(62) Division of application No. 13/129,386, filed as application No. PCT/CN2010/080652 on Dec. 31, 2010, now Pat. No. 8,937,322.

(30) Foreign Application Priority Data

Nov. 9, 2010    (CN) .......................... 2010 1 0538428

(51) Int. Cl.
*H01L 21/00*    (2006.01)
*H01L 33/38*    (2010.01)
*H01L 33/20*    (2010.01)
*H01L 33/46*    (2010.01)

(52) U.S. Cl.
CPC .............. *H01L 33/382* (2013.01); *H01L 33/20* (2013.01); *H01L 33/38* (2013.01); *H01L 33/46* (2013.01); *H01L 2933/0016* (2013.01); *H01L 2933/0091* (2013.01)

(58) Field of Classification Search
CPC ..... H01S 5/227; H01S 5/2275; H01S 5/2231; H01L 33/0065
USPC ........................................ 438/40, 42, 43, 706
See application file for complete search history.

(56) References Cited

U.S. PATENT DOCUMENTS 6,794,282 B2 *   9/2004   Goebel et al. ..... H01L 27/10888
                                                    257/E21.588
7,520,644 B2     4/2009   Jordan et al.
(Continued)

FOREIGN PATENT DOCUMENTS

CN          1858918 A       11/2006
CN          1860620 A       11/2006
(Continued)

OTHER PUBLICATIONS

Examination Report issued by the European Patent Office, dated Jul. 14, 2014, for European Patent Application No. 10829323.4; 7 pages.
(Continued)

*Primary Examiner* — Quoc Hoang
(74) *Attorney, Agent, or Firm* — Faegre Baker Daniels LLP

(57) ABSTRACT

An LED includes a first electrode, for connecting the LED to a negative electrode of a power supply and a substrate located on the first electrode in which a plurality of contact holes are formed extending through the substrate. The diameter of upper parts of the contact holes is less than the diameter of lower parts of the contact holes, and the contact holes are filled with electrode plugs connecting the first electrode to the LED die. The light emitting device includes the LED, and further includes a susceptor and an LED mounted on the susceptor. The manufacturing method includes forming successively an LED die and a second electrode on a substrate, patterning a back surface of the substrate to form inverted trapezoidal contact holes which expose the LED die, and filling the contact holes with conductive material until the back face of the substrate is covered by the conductive material.

3 Claims, 9 Drawing Sheets

(56) References Cited

U.S. PATENT DOCUMENTS

| | | | |
|---|---|---|---|
| 7,737,562 B2 * | 6/2010 | Higaki et al. | H01L 24/97 257/701 |
| 7,851,817 B2 | 12/2010 | Yasuda et al. | |
| 8,183,591 B2 * | 5/2012 | Kim | H01L 33/382 257/99 |
| 8,809,874 B2 | 8/2014 | Chang | |
| 2002/0074556 A1 | 6/2002 | Kwak et al. | |
| 2002/0117681 A1 | 8/2002 | Weeks et al. | |
| 2002/0139990 A1 | 10/2002 | Suehiro et al. | |
| 2004/0173810 A1 | 9/2004 | Lin et al. | |
| 2004/0217361 A1 | 11/2004 | Negley | |
| 2005/0211997 A1 | 9/2005 | Suehiro et al. | |
| 2006/0102925 A1 | 5/2006 | Liu et al. | |
| 2006/0163596 A1 | 7/2006 | Kim et al. | |
| 2007/0200128 A1 | 8/2007 | Yano | |
| 2008/0296595 A1 | 12/2008 | Chu | |
| 2009/0272994 A1 | 11/2009 | Lim | |
| 2010/0079050 A1 | 4/2010 | Kamamori et al. | |
| 2010/0123162 A1 | 5/2010 | Kondo et al. | |
| 2010/0230695 A1 | 9/2010 | Lan et al. | |
| 2010/0244083 A1 | 9/2010 | Kim | |
| 2011/0108800 A1 | 5/2011 | Pan | |
| 2012/0037935 A1 | 2/2012 | Yang | |
| 2012/0299042 A1 | 11/2012 | Choi et al. | |
| 2013/0193406 A1 | 8/2013 | Xiao et al. | |

FOREIGN PATENT DOCUMENTS

| | | |
|---|---|---|
| CN | 101132041 A | 2/2008 |
| CN | 201044245 Y | 4/2008 |
| CN | 201307601 Y | 9/2009 |
| CN | 101615646 A | 12/2009 |
| CN | 101714596 A | 5/2010 |
| EP | 1225643 A1 | 7/2002 |
| EP | 1 460 694 | 9/2004 |
| EP | 1670073 A1 | 6/2006 |
| JP | 2008060330 A | 3/2008 |

OTHER PUBLICATIONS

Extended European Search Report issued by the European Patent Office, Rijswijk, NL, dated May 3, 2013, for European Application No. 10827694.0; 6 pages.

International Search Report and Written Opinion (in Chinese), issued by The State Intellectual Property Office, Beijing, China, dated Aug. 11, 2011, for related International PCT Application No. PCT/CN2010/080654; 10 pages.

English Translation of the International Search Report; ISA—The State Intellectual Property Office, Beijing, China, dated Aug. 11, 2011, for related International PCT Application No. PCT/CN2010/080654; 2 pages.

International Search Report and Written Opinion (in Chinese), issued by The State Intellectual Property Office, Beijing, China, dated Aug. 18, 2011, for related International PCT Application No. PCT/CN2010/080652; 13 pages.

English Translation of the International Search Report; ISA—The State Intellectual Property Office, Beijing, China, dated Aug. 18, 2011, for related International PCT Application No. PCT/CN2010/080652; 6 pages.

Extended European Search Report issued by the European Patent Office, Rijswijk, NL, dated Oct. 9, 2013, for European Patent Application No. 10829323.4; 7 pages.

English Translation of the Written Opinion, the State Intellectual Property Office, Beijing, China, dated Aug. 8, 2011, for International PCT Application No. PCT/CN2010/080652; 5 pages.

International Preliminary Report on Patentability (Chinese language), The International Bureau of WIPO, Geneva, Switzerland, dated May 14, 2013, for International PCT Application No. PCT/CN2010/080652; 6 pages.

English Translation of the International Preliminary Report on Patentability, The International Bureau of WIPO, Geneva, Switzerland, dated May 14, 2013, for International PCT Application No. PCT/CN2010/080652; 6 pages.

English Translation of the Written Opinion, The State Intellectual Property Office, Beijing, China, dated Aug. 1, 2011, for International PCT Application No. PCT/CN2010/080654; 3 pages.

International Preliminary Report on Patentability (Chinese language), The International Bureau of WIPO, Geneva, Switzerland, dated May 14, 2013, for International PCT Application No. PCT/CN2010/080654; 4 pages.

English Translation of the International Preliminary Report on Patentability, The International Bureau of WIPO, Geneva, Switzerland, dated May 14, 2013, for International PCT Application No. PCT/CN2010/080654; 4 pages.

* cited by examiner

LIGHT EMITTING DIODE AND A MANUFACTURING METHOD THEREOF, A LIGHT EMITTING DEVICE

CROSS-REFERENCE TO RELATED APPLICATIONS

The present application is a divisional application claiming priority to U.S. patent application Ser. No. 13/129,386 filed May 13, 2011, which is a national stage application of PCT/CN2010/080652, filed Dec. 31, 2010, which claims priority to Chinese Patent Application No. 201010538428.3, entitled "A light emitting diode and a manufacturing method thereof, a light emitting device", and filed Nov. 9, 2010, the complete disclosures of which are expressly incorporated herein by reference.

FIELD OF THE INVENTION

The present invention relates to semiconductor technology, and particularly relates to a light emitting diode and a manufacturing method thereof, and a light emitting device.

BACKGROUND OF THE INVENTION

A light emitting diode (LED) is a semiconductor device which is activated by current to generate light of various colors. The III-V compound semiconductors, such as gallium nitride (GaN), which have wide band gap, high luminous efficiency, high electron saturation drift velocity, and stable chemical properties, have great application potential in high-brightness blue light emitting diodes, blue laser and other optoelectronic devices areas, and have aroused wide attention.

However, semiconductor light emitting diodes have low luminous efficiency in the prior art. As for light emitting diodes without package, the luminous efficiency is only a few percent. A lot of energy inside the device can not be sent out, thereby not only causing energy waste, but also affecting lifetime of the device. Therefore, it is of key importance to improve the luminous efficiency of semiconductor light emitting diodes.

Because of the above application requirements, a plurality of methods for improving the luminous efficiency of semiconductor light emitting diodes have been applied in device structure, for example, surface roughness, Metal reflector structure, and so on. Chinese patent publication No. CN1858918A discloses a kind of light emitting diodes and the under surface of the light emitting diodes forms an omnidirectional reflector structure, whereby the luminous efficiency of the light emitting diodes is improved. However, the method disclosed in this prior art needs to form a film comprising a plurality of high refractive index layers and low refractive index layers stacked on the substrate, of which the manufacturing process is very complex.

SUMMARY OF THE INVENTION

An object of the present invention is to provide a light emitting diode having high luminous efficiency.

To achieve the object, the present invention provides a light emitting diode, comprising: a first electrode adapted for connecting the LED and a negative electrode of a power supply, a substrate set on the first electrode and an LED die set on the substrate. A plurality of contact holes are formed extending through the substrate and the diameter of upper parts of the contact holes is less than the diameter of lower parts of the contact holes. The contact holes are filled with electrode plugs which are for connecting the first electrode and the LED die.

Accordingly, the present invention provides a light emitting device which comprises a light emitting diode described above, wherein the light emitting device further comprises a susceptor and the LED is mounted on the susceptor.

Accordingly, the present invention provides a method for manufacturing the LED, comprising: forming successively an LED die and a second electrode on a substrate; patterning a back surface of the substrate to form inverted trapezoidal contact holes which expose the LED die; and filling the contact holes with conductive material till the back face of the substrate is covered by the conductive material.

In comparison with conventional technologies, the present invention has the following advantages:

1. The contact holes are formed in the substrate and the first electrode is connected to the LED die through the electrode plugs formed in the contact holes, which reduces the current density, thus reducing the auger recombination and improving the internal quantum efficiency of the LED;

2. The diameter of upper parts of the contact holes is less than the diameter of lower parts of the contact holes and a sidewall of the substrate is adapted for reflecting the light emitting from the LED die to a light exiting surface of the LED, which improves the luminous efficiency of the LED.

3. It is unnecessary for the method described above to form a multilayer film, therefore the manufacturing method is relatively easy to implement.

DESCRIPTION OF THE PREFERRED EMBODIMENTS

Hereunder, the present invention will be described in detail with reference to embodiments, in conjunction with the accompanying drawings.

Although the present invention has been disclosed hereinafter as above with reference to preferred embodiments in details, the present invention can be implemented in other embodiments which are different. Therefore, the present invention should not be limited to the embodiments disclosed here.

As taught in the background of the invention, in order to improve the luminous efficiency of semiconductor light emitting diodes, the method disclosed in the prior art needs to form a film comprising a plurality of high refractive index layers and low refractive index layers stacked on the substrate, and the production process of the film is very complex.

In order to solve this problem, the present invention provides a light emitting device comprising a light emitting diode. The light emitting diode comprises: a first electrode adapted for connecting the LED and a negative electrode of a power supply, a substrate set on the first electrode and an LED die set on the substrate. A plurality of contact holes are formed passing through the substrate, and the diameter of upper parts of the contact holes is less than the diameter of lower parts of the contact holes. The contact holes are filled with electrode plugs which are for connecting the first electrode and the LED die. The first electrode is connected to the LED die through a plurality of electrode plugs formed in the contact holes, which reduces current density and Auger recombination, thereby improving the internal quantum efficiency and increasing the luminous efficiency of the LED.

Figure 1:
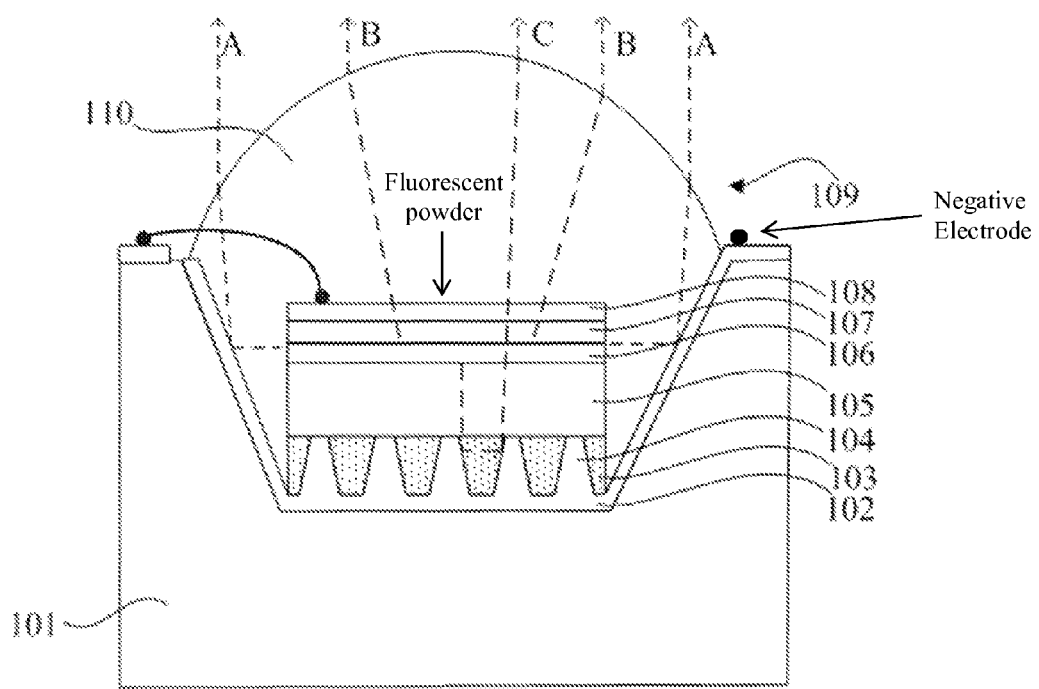
FIG. 1 is a schematic view of a light emitting device in the first embodiment.

FIG. 1 is a schematic view of a light emitting device in the first embodiment. The light emitting device comprises a susceptor 101 and an LED 109 set on the susceptor, wherein the susceptor comprises an installation pit for accommodating the LED 109. An angle θ formed by a sidewall of the installation pit and a bottom wall of the installation pit ranges from 130° to 150°. The sidewall of the installation pit is adapted for reflecting the light emitting from the LED 109 to a light exiting surface of the LED 109, which improves the luminous efficiency of the light emitting device.

The susceptor 101 uses conductive material having good heat dispersion characteristics, which can disperse the heat from the LED and electrically connect the LED 109 and the negative electrode of a power supply.

Specifically, the susceptor 101 is made from materials such as silicon or aluminium, etc. The diameter of upper parts of the contact holes is 4 μm, and the diameter of lower parts of the contact holes is 2 μm. The installation pit has a large upper contact hole and a small bottom contact hole, which guarantees that the angle θ formed by the inner sidewall of the installation pit and the bottom wall of the installation pit is 130°~150° and the sidewall of the installation pit reflects light emitted form LED to light exiting surface of the light emitting device.

Preferably, the susceptor 101 also connects a first lead, which is used to connect the susceptor 101 to the negative electrode of the power supply.

The LED 109 is positioned in the installation pit of the susceptor 101. The LED 109 includes: a first electrode 102, a substrate 103 located on the first electrode 102, an LED die located on the substrate 103, and a second electrode 108 located on the LED die.

The first electrode 102 is positioned on the bottom of the installation pit of susceptor 101. The first electrode 102 is used to electrically connect the LED 109 and a negative electrode of the power supply. Specifically, the first electrode 102 is made from conductive metals, such as titanium, aluminum or gold, etc. Optionally, the first electrode 102 covers the sidewall of the susceptor 101, which increases the contact area of the first electrode 102 and the susceptor 101, thereby achieving good electrical connection.

A plurality of contact holes which extends through the substrate 103 are formed in the substrate 103. Electrode plugs 104 are formed in the contact holes, which are used to connect the first electrode 102 to the LED die. Specifically, the substrate 103 is made up of sapphire, and the electrode plugs 104 are made up of conductive metals, such as titanium, aluminum or gold, etc. The contact holes are evenly distributed in the substrate 103. The electrode plugs 104 are adapted for connecting the first electrode 102 to the LED die, which reduce the current density and auger recombination, thus improving the internal quantum efficiency and luminous efficiency of the LED.

The LED die is above the contact holes, and the first electrode 102 is below the contact holes. The cross section of the contact holes is trapezoidal, and the diameter of upper parts of the contact holes is less than the diameter of lower parts of the contact holes. According to this embodiment, the diameter of lower parts of the contact holes ranges from 5 μm to 20 μm. The diameter of upper parts of the contact holes is less than the diameter of lower parts of the contact holes, which guarantees that the sidewalls surrounding the contact holes form a certain degree with respect to the bottom surface of the contact holes, and the sidewalls reflect light emitted form LED die to light exiting surface of LED, which improves the luminous efficiency of the LED.

An n-type semiconductor layer 105, an active layer 106 and a p-type semiconductor layer 107 which are successively located on the substrate 103 and the buffer layer 104 constitute the LED die. The material of the n-type semiconductor layer 105 includes n-type gallium nitride, and the active layer 106 includes multi-quantum well active layer. Specifically, the material of the multi-quantum well active layer includes InGaN, and the material of the p-type semiconductor layer 107 includes p-type gallium nitride.

The second electrode 108 is located on the LED die, which is used to electrically connect the LED 109 and a positive electrode of the power supply. Specifically, the second electrode 108 is made from conductive metals, such as nickel or gold, etc. Preferably, the second electrode 108 is connected with a second lead; the second lead is used to connect the LED 109 to the positive electrode of the power supply.

Preferably, the light emitting device further includes a lens structure 110, which covers the LED and is adapted for converging light emitted from the LED 109, thereby improving the lightness of the light emitting device. Preferably, the lens structure 110 fills the gap between the LED 109 and the susceptor 101. Specifically, the lens structure 110 converges the light emitted from the LED (shown as light path B), the light emitted from the LED die and reflected by the sidewall of the susceptor, or reflected by the first electrode (shown as light path A), and the light emitted from the LED die and reflected by the sidewalls of the inverted trapezoidal components of the substrate (shown as light path C), thus improving the lightness of the light emitting device.

The light emitting device further includes fluorescent powder (now shown) covering the lens structure, which is used for emitting white light. Specifically, for blue-light LED, the fluorescent powder is YAG fluorescent powder including Ce3+.

Figure 2:
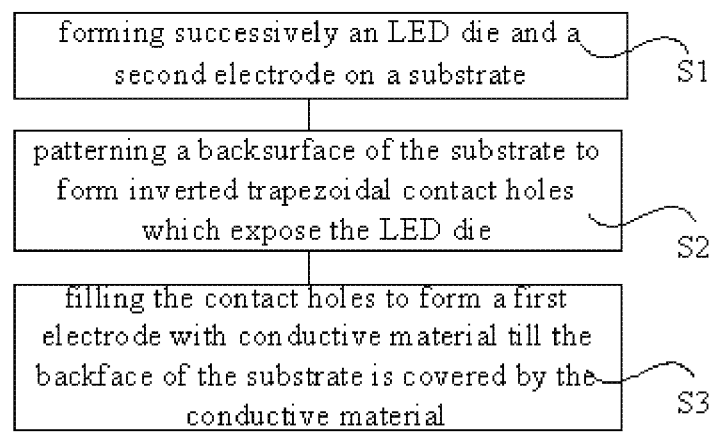
FIG. 2 is a flow chart of a method for manufacturing a light emitting diode in the first embodiment.

There is also provided a method for manufacturing an LED in the present invention. FIG. 2 is a flow diagram of an embodiment of the method for manufacturing an LED. The method includes:

S1, forming on a substrate an LED die and a second electrode successively;

S2, patterning a back surface of the substrate to form inverted trapezoidal contact holes which expose the LED die;

S3, filling the contact holes with conductive material till the back face of the substrate is covered by the conductive material.

FIG. 3 to FIG. 8 are sectional views of an embodiment of an LED formed by the method for manufacturing an LED in the present invention; each step is described below in more detail in conjunction with the accompanying drawings.

Figure 3:
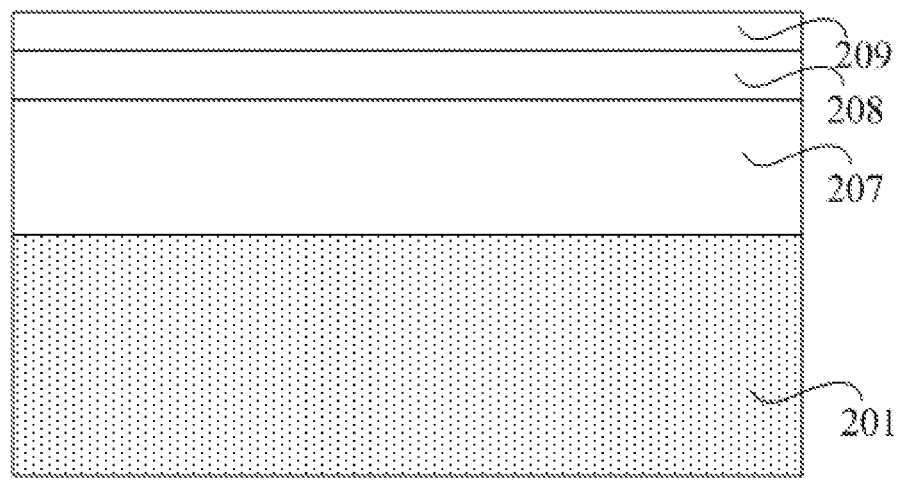
FIG. 3 to FIG. 8 are sectional views of an embodiment of an LED formed by the method for manufacturing an LED in the present invention.

Referring to FIG. 3, in step S1, the substrate is sapphire. Specifically, by using a Metal-organic Chemical Vapor Deposition (MOCVD) process, an n-type semiconductor layer 207, an active layer 208 and a p-type semiconductor layer 209 are deposited on a substrate 201. The n-type semiconductor layer 207, the active layer 208 and the p-type semiconductor layer 209 constitute the LED die. The material of the n-type semiconductor layer 207 includes n-type gallium nitride, and the active layer 208 includes multi-quantum well active layer.

Specifically, the material of the multi-quantum well active layer includes InGaN, and the material of the p-type semiconductor layer 107 includes p-type gallium nitride.

Figure 4:
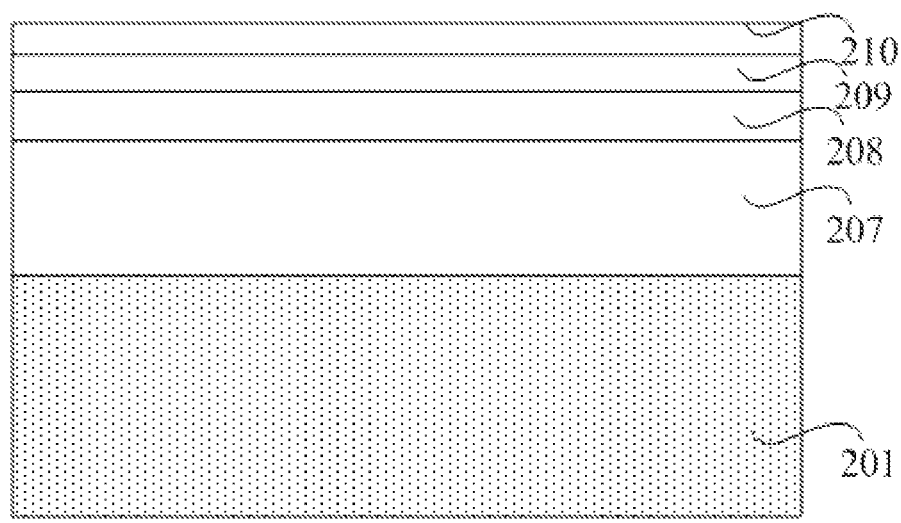
Figure 5:
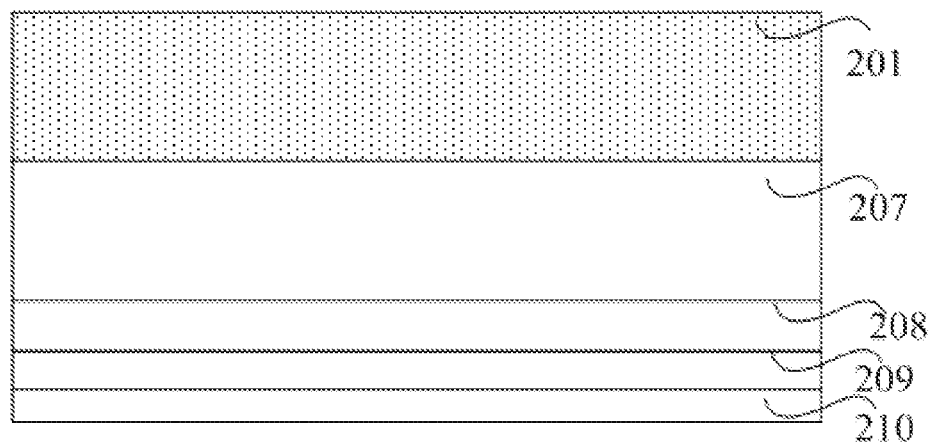

Referring to FIG. 4, still in step S1, a second electrode is formed in the LED die. The second electrode includes nickel or gold, and is formed through a Physical Vapor Deposition process or an E-gun evaporation process.

Preferably, before performing the step S2, a thickness reduction process is performed on the back face of the substrate 201. Specifically, the thickness reduction process is chemical mechanical polishing (CMP). The thickness of the substrate 201 is reduced to 20~50 nm. The thickness reduction process which reduces the thickness of the substrate 201 benefits the later patterning process, and makes the substrate 201 easy for patterning.

Figure 9:
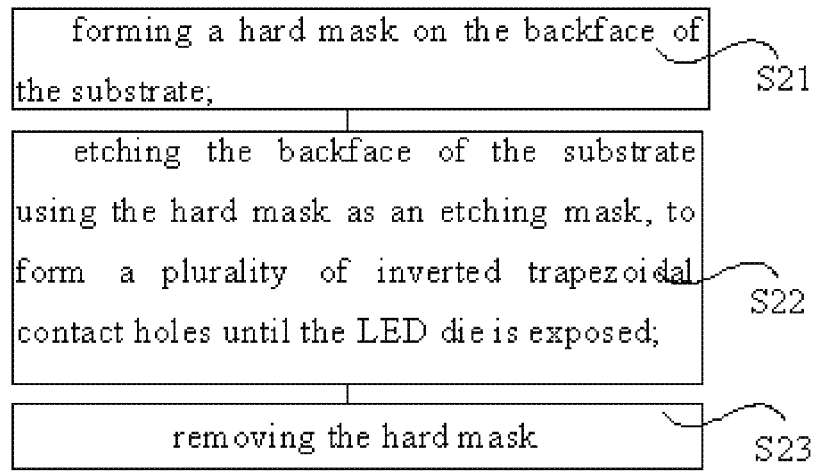
FIG. 9 is a flow chart of the step S2 in the first embodiment according to the method shown in FIG. 2.

Referring to FIG. 9, which is a flow diagram of a preferable embodiment of the step S2 in FIG. 2, the step S2 includes:
S21, forming a hard mask on the back face of the substrate;
S22, etching the back face of the substrate using the hard mask as an etching mask, to form a plurality of inverted trapezoidal contact holes until the LED die is exposed;
S23, removing the hard mask.

Figure 6:
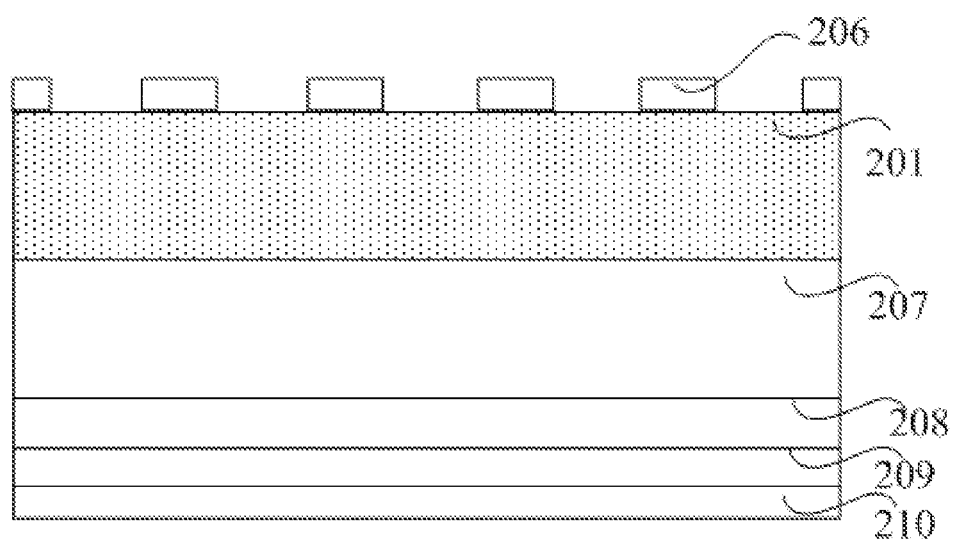

Referring FIG. 6, step S21 includes: depositing hard mask material on the back face of the substrate 201, and then patterning the hard mask material by photo-etching and etching to form a hard mask 206. Specifically, the hard mask 206 is made from silicon dioxide.

Figure 7:
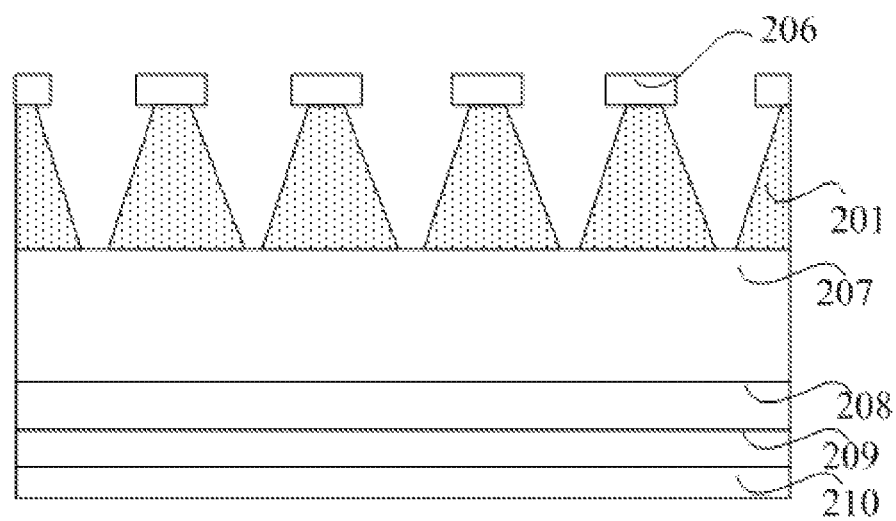

Referring to FIG. 7, step S22 includes: wet etching the substrate 201 from the back face of the substrate 201 using the hard mask 206 as an etching mask to form a plurality of inverted trapezoidal contact holes on the regions not covered by the hard mask 202, until the LED die is exposed by all the contact holes. Specifically, the substrate is sapphire, and an anisotropic etching is performed to the sapphire substrate with a mixed solution of sulfuric acid and phosphoric acid.

It should be noted that the solution used in wet etching has a high selection ratio to the substrate 201, to avoid etching the hard mask 206. Specifically, the substrate 201 is a sapphire substrate (aluminum oxide), the hard mask 206 is silicon dioxide, and the substrate 201 is etched with a mixed solution of sulfuric acid and phosphoric acid, which has a small corrosive action upon silicon dioxide.

In step S23, the hard mask 206 includes silicon dioxide and is removed with hydrofluoric acid solution.

As for the step S1, preferably, adjacent hard mask patterns in the hard mask 206 have an interval of 0.1~10 μm, and the depth of the contact hole is the same as the substrate 201. Specifically, the depth of the contact holes ranges form 20 μm to 50 μm; the diameter of lower parts of the contact holes ranges form 5 μm to 20 μm.

Figure 8:
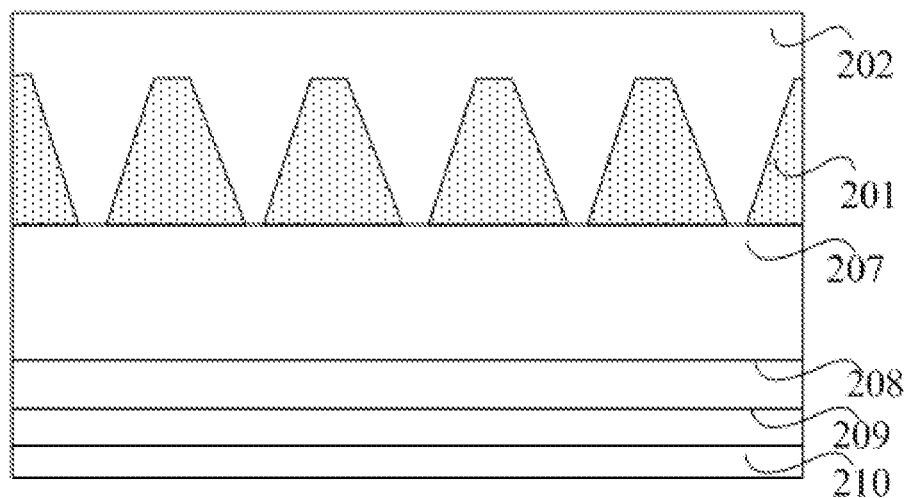

Referring to FIG. 8, in step S3, the contact holes are filled and filled up with conductive material by Physical Vapor Deposition (PVD); and a conductive material layer is formed overlying the back face of the substrate, which forms a first electrode 202. The conductive material filled in the contact holes forms electrode plugs of the first electrode 202. The first electrode 202 electrically connects to the n-type semiconductor layer 207 through the electrode plugs. Specifically, the conductive material is conductive metal, such as titanium, aluminum or gold, etc.

The method for manufacturing an LED is finished.

The method for manufacturing a light emitting device which includes an LED further includes steps: providing a susceptor, the susceptor including an installation pit; and fixing an LED on the bottom of the installation pit of the susceptor, in a way that the first electrode is connected with the bottom of the installation pit. The inner side wall and a bottom of the installation pit forms an angle of 130°~150°, which inner side wall reflects light from the LED, thus improving the luminous efficiency of the LED. The susceptor is made from conductive material having good heat dispersion characteristics, such as silicon or aluminium. The dimension of the upper opening of the installation pit is 4 μm, and the dimension of the bottom opening of the installation pit is 2 μm.

The method for manufacturing a light emitting device further includes: forming a lens structure covering the second electrode. Preferably, the lens structure is formed covering the second electrode and filling the gap between the LED and the susceptor. The lens structure converges the light emitted from the LED.

The method for manufacturing a light emitting device further includes: coating the lens structure with fluorescent powder, which is used to emit white light. For blue-light LED, the fluorescent powder is YAG fluorescent powder including Ce3+, which is used to emit white light.

Preferably, the method for manufacturing a light emitting device further includes: coating the sidewalls with conductive material, and the conductive material is connected to the first electrode (as shown in FIG. 1), which increases the contact areas of the first electrode and the susceptor, thereby achieving good electrically connection.

The method for manufacturing a light emitting device further includes: providing a first lead which connects the susceptor to the negative electrode of a power supply, and providing a second lead which connects the second electrode to the positive electrode of a power supply.

A light emitting device has been manufactured.

The method provided in the present invention is easy to implement.

Although the present invention has been disclosed as above with reference to preferred embodiments thereof but will not be limited thereto. Those skilled in the art can modify and vary the embodiments without departing from the spirit and scope of the present invention. Accordingly, the scope of the present invention shall be defined in the appended claims.

What is claimed is:

1. A method for manufacturing an LED comprising:
forming successively an LED die and a second electrode on a substrate, wherein the substrate is sapphire;
patterning a back surface of the substrate to form inverted trapezoidal contact holes which expose the LED die; and
filling the contact holes with conductive material until the back face of the substrate is covered by the conductive material;
wherein patterning a back surface of the substrate to form inverted trapezoidal contact holes which expose the LED die comprises:
forming a hard mask on the back face of the substrate, wherein the hard mask is silicon dioxide;
performing an anisotropic etching to the upper surface of the sapphire substrate with a mixed solution of sulfuric acid and phosphoric acid using the hard mask as an etching mask to form a plurality of inverted trapezoidal contact holes until the LED die is exposed; and
removing the hard mask with a hydrofluoric acid solution.

2. The method for manufacturing an LED of claim 1, wherein before patterning the back surface of the substrate, the method further comprises a thickness reduction process of the substrate from the back face of the substrate.

3. The method for manufacturing an LED of claim 1, wherein a step of filling the contact holes with conductive material comprises: filling the contact holes with conductive material by physical vapor deposition.

* * * * *